(12) United States Patent
Schuster et al.

(10) Patent No.: US 6,771,072 B2
(45) Date of Patent: Aug. 3, 2004

(54) MAGNETIC RESONANCE APPARATUS WITH AN ELECTRICAL CONDUCTOR ARRANGEMENT FOR ELECTRICAL SUPPLY TO A CONDUIT

(75) Inventors: Johann Schuster, Oberasbach (DE); Stefan Stocker, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/342,007

(22) Filed: Jan. 14, 2003

(65) Prior Publication Data
US 2003/0141870 A1 Jul. 31, 2003

(30) Foreign Application Priority Data
Jan. 31, 2002 (DE) .......................................... 102 03 788

(51) Int. Cl.⁷ ................................................. G01V 3/00
(52) U.S. Cl. ...................................... 324/318; 324/322
(58) Field of Search .............................. 324/318, 322, 324/319, 320, 300, 312, 314, 306, 307, 309

(56) References Cited

U.S. PATENT DOCUMENTS

| | | |
|---|---|---|
| 3,564,108 A | 2/1971 | Scmitz |
| 5,280,247 A * | 1/1994 | DeMeester et al. ......... 324/318 |
| 5,394,086 A | 2/1995 | Patrick et al. |
| 5,442,131 A * | 8/1995 | Borgwarth ................. 174/15.6 |
| 6,111,412 A | 8/2000 | Boemmel et al. |
| 6,236,207 B1 | 5/2001 | Arz et al. |
| 6,323,469 B1 | 11/2001 | Bissdorf et al. |
| 6,552,545 B2 * | 4/2003 | Kaindl et al. ............... 324/318 |

FOREIGN PATENT DOCUMENTS

| | | |
|---|---|---|
| DE | OS 195 04 742 | 8/1996 |
| DE | OS 101 08 843 | 1/2002 |
| GB | 2 342 986 | 4/2000 |

* cited by examiner

Primary Examiner—Louis Arana
(74) Attorney, Agent, or Firm—Schiff Hardin LLP

(57) ABSTRACT

A magnetic resonance apparatus has a gradient coil that is connected to an electrical conductor arrangement for electrical supply, the conductor arrangement having an inner conductor and an outer conductor that coaxially surrounds the inner conductor and a cooling channel for transmission of a coolant that is arranged between the inner and outer conductors.

20 Claims, 3 Drawing Sheets

MAGNETIC RESONANCE APPARATUS WITH AN ELECTRICAL CONDUCTOR ARRANGEMENT FOR ELECTRICAL SUPPLY TO A CONDUIT

BACKGROUND OF THE INVENTION

1. Field of the Invention

The present invention is directed to a magnetic resonance apparatus having a gradient coil that is connected to an electrical conductor arrangement for electrical supply to the gradient coil.

2. Description of the Prior Art

For energy supply in a magnetic resonance apparatus, gradient coils of a gradient coil system are connected to a gradient feed amplifier via a cable. Magnetic resonance technology is thereby a known technique for acquiring images of the inside of the body of an examination subject. In a magnetic resonance apparatus, rapidly switched gradient fields that are generated by a gradient system are superimposed on a static basic magnetic field that is generated by a basic magnet system. The magnetic resonance apparatus also has a radio-frequency system that beams radio-frequency signals into the examination subject for triggering magnetic resonance signals and that picks up the triggered magnetic resonance signals, from which magnetic resonance images are produced.

Appropriate currents must be set in the gradient coils for generating the gradient fields. The amplitudes of the required currents thereby amount to up to several 100 A. The current rise and decay rates amount to up to several 100 kA/s. The driving voltages for the currents that the gradient amplifier must offer thus amount to up to several kV.

Given the presence of the basic magnetic field on the order of magnitude of 1 T, considerable Lorentz forces that lead to oscillations of the overall gradient coil system act on the electrical conductors of the gradient coils. Lorentz forces likewise act on current-carrying electrical conductor arrangements disposed in the region of the basic magnetic field, for example between the gradient coils and the gradient amplifiers.

U.S. Pat. No. 5,394,086 discloses a connecting cable for an employable gradient coil for a magnetic resonance apparatus, wherein the forward and return conductors of the connecting cable are arranged such that the forces that act on the connecting cable arranged in the static basic magnetic field, given a flow of current in the conductors, mutually cancel. In one embodiment, the connecting cable is fashioned as a coaxial cable.

Gradient coils are often cooled as a consequence of the aforementioned, high electrical powers. For example, German OS 197 21 985 discloses a cooling device for the indirect cooling of conductors of the gradient coils. A flexible cooling conduit that is laid so as to have dense flowpaths and through which a coolant is conducted for cooling the gradient coils is introduced into a cylindrical jacket-shaped radial plane of a hollow-cylindrical gradient coil system that is cast with casting resin. In another embodiment of German OS 198 39 987, a conductor of a gradient coil is directly cooled by a coolant conducted through an inner cooling channel that is surrounded by the conductor as profiled segment conductor.

A cable having a direct forced cooling of an electrical conductor is also known from the book Kabelhandbuch, VWEW Verlag, Frankfurt am Main, 1997, page 61, published by the Vereinigung Deutscher Elektrizitätswerke e. V. The cable has a waveguide in its interior that is surrounded by the electrical conductor. An elimination of the waste heat arising in the electrical conductor when a current flows ensues by conducting a coolant, for example oil, through the waveguide.

German OS 101 08 843 discloses a coolable coaxial conductor with an enveloping protective cladding wherein two tubular conductor elements are guided essentially coaxially inside one another as inner and outer conductors. The walls of this tubular conductor elements are maintained spaced from one another over their length by electrically insulating, temperature-resistant spacers. The inner conductor, the outer conductor and the protective cladding define free spaces through which a fluid, particularly air, can flow.

Further, German OS 195 04 742 discloses a water-cooled coaxial cable for a forward and return line for electrical current. The coaxial cable has a flexible inner conductor, a inner conduit of elastic, electrically insulating material that cylindrically surrounds the inner conductor spaced therefrom, a flexible outer conductor that cylindrically surrounds the inner conduit spaced therefrom, and an outer conduit of elastic, electrically insulating material that cylindrically surrounds the outer conductor spaced therefrom. Water can be conducted through the inner conduit and through the interspace between inner and outer conduit, which are galvanically separated from one another.

Finally, U.S. Pat. No. 3,564,108 discloses a coaxial transmission line having an inner conductor and an outer conductor that is spaced such from the inner conductor so that an air space remains between the conductors. An outer surface of the inner conductor and an inner surface of the outer conductor are thereby thinly covered with a material that exhibits low dielectric losses.

SUMMARY OF THE INVENTION

An object of the invention is to provide an improved magnetic resonance apparatus having a gradient coil that is connected to an electrical conductor arrangement for electrical supply such that, among other things, a high electrical power can be transmitted to the gradient coil with a compact structure.

The object is inventively achieved in a magnetic resonance apparatus having a gradient coil that is connected to an electrical conductor arrangement for electrical supply, the conductor arrangement according having an inner conductor and an outer conductor that coaxially surrounds the inner conductor and with a cooling channel for transmission of a coolant that is arranged between the inner and outer conductors.

Compared to a comparable coaxial conductor arrangement without a possibility of cooling between the conductors, a higher electrical transmission power can be realized.

DESCRIPTION OF THE PREFERRED EMBODIMENTS

Figure 1:
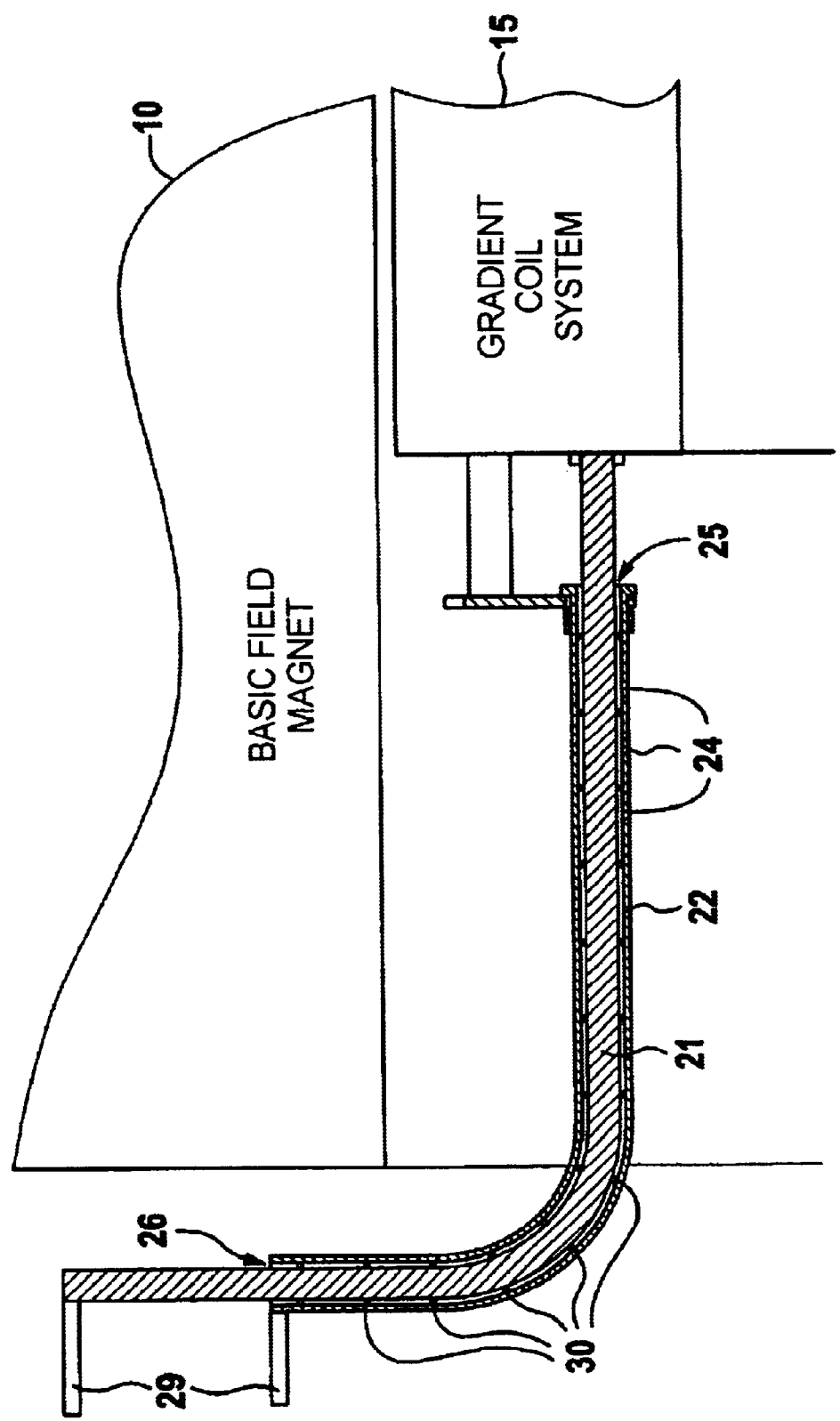
FIG. 1 is a longitudinal section through a portion of a magnetic resonance apparatus with an electrical conductor arrangement for a supply of a gradient coil system in accordance with the invention.

As an exemplary embodiment of the invention, FIG. 1 shows a longitudinal section through a portion of a magnetic resonance apparatus (magnetic resonance data acquisition system). The magnetic resonance apparatus has a basic field magnet 10 that is essentially fashioned as a hollow cylinder having a horizontal longitudinal axis and with which an optimally uniform, static basic magnetic field can be generated within a hollow interior of the basic field magnet 10. Further, the magnetic resonance apparatus has a gradient coil system 15 for generating gradient fields, the system 15 being likewise essentially fashioned as a hollow cylinder having a horizontal longitudinal axis. The gradient coil system 15 is permanently installed in the hollow interior, of the basic field magnet 10. In the longitudinal section along the principal symmetry plane of the hollow cylinder, FIG. 1 shows an upper region of the hollow cylinder at the end faces thereof.

Electrical energy supply of at least one gradient coil of the gradient coil system 15 thereby ensues via an electrical conductor arrangement having an inner conductor 21 and an outer conductor 22 that coaxially surrounds the inner conductor 21. A cooling channel for the transmission of a coolant is arranged between the inner and outer conductors 21 and 22. At the gradient coil system 15, the conductors 21 and 22 are connected to the gradient coil via corresponding electrical terminals. The conductor arrangement is laid inside the hollow approximately parallel to the longitudinal axis of the hollow cylinder and is conducted arcuately upwardly at the opening of the hollow interior, where the conductor arrangement is secured to the end face of the basic field magnet 10 via an insulating plate (not shown). An electrical supply cable that proceeds from a gradient amplifier feeding the gradient coil is connectable thereat via the electrical terminals 29.

As forward and return conductors of the gradient coil, the outer and the inner conductor 21 and 22 are fashioned for an identical current-carrying capability. The inner conductor 21, which is fashioned as a single wire, has a circular cross-section. The conductors 21 and 22 are fashioned, for example, of soft electrolyte copper or pure aluminum. The outer conductor 22 is thereby formed of a solid material, for example as a bendable copper tube.

The inner and the outer conductor 21 and 22 are maintained spaced from one another by a number of centering elements 35 that are distributed along the conductor arrangement. The centering elements 35 are formed of an electrically insulating material, for example Teflon®, and are arranged at a distance of, for example, approximately 5 cm from one another and have a thickness of a few millimeters. Further, the centering elements 35 arranged between the inner and the outer conductor 21 and 22 are shaped such that openings remain between the inner and outer conductors 21 and 22 in the region of the centering elements 35, so that a coolant can flow through in longitudinal direction of the conductor arrangement between the inner and outer conductors 21 and 22.

The outer conductor 22 has bores in the region thereof toward the gradient coil. In addition to the opening 25 at the end of the outer conductor 22 at the side of the gradient coil, air as a coolant can thereby additionally flow through the bores 24 into the cooling channel between the inner and outer conductors 21 and 22, and emerge at the opening 26 at the other end of the outer conductor 22 as a result of the chimney effect. The convection cooling that thereby arises particularly produces a cooling of the inner conductor 21, which is otherwise difficult to access. Compared to a comparable coaxial conductor arrangement without cooling of the inner conductor, the electrical transmission power is notably increased.

In another embodiment, the gradient coil system is fashioned to be movable at least in a horizontal direction in the hollow interior of the basic field magnet 10. The conductor arrangement in this embodiment is flexibly designed between the fastening points at the end face of the basic field magnet 10 and at the movable gradient coil system. This can be achieved, for example, with an accordion bellows-like or corrugated fashioning of the outer conductor and an inner conductor that is formed by multiple wires.

Figure 2:
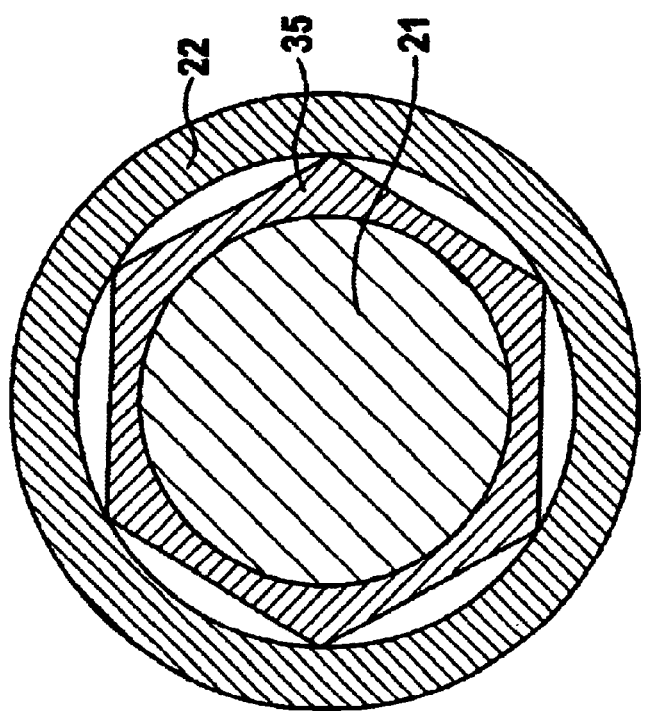
FIG. 2 is a cross-section through the conductor arrangement of FIG. 1.

FIG. 2 shows a cross-section through the conductor arrangement of FIG. 1 in the region of one of the centering elements 35. It can be seen that, as a result of its fashioning with a circular inside cross-section corresponding to the cross-section of the inner conductor 21, and a hexagonal outside cross-section toward the outer conductor 22, the centering element 35 leaves corresponding openings free for the passage of the coolant in the longitudinal direction of the conductor arrangement. In another embodiment, functionally identical centering elements but with respectively a different cross-sections are used, and/or only one centering element that extends over the entire longitudinal course of the conductor arrangement is utilized.

Figure 3:
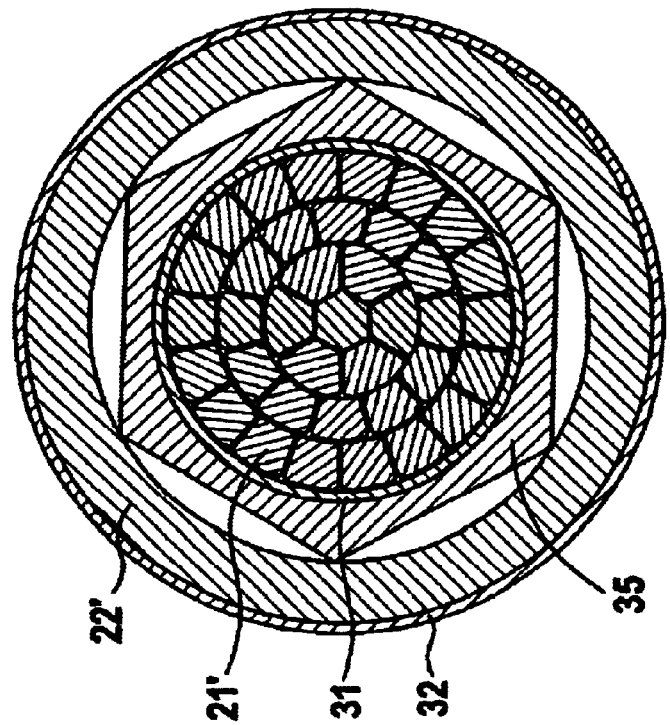
FIG. 3 is a cross-section through a further embodiment of the inventive electrical conductor arrangement.

As a further exemplary embodiment of the invention, FIG. 3 shows a cross-section through a further electrical conductor arrangement having an inner, multi-wire compressed conductor 21' and an outer conductor 22' that coaxially surrounds the inner conductor 21'. Compared to the conductor arrangement shown in FIG. 2, the conductor arrangement shown in FIG. 3 has electrically insulating layers 31 and 32 applied on the outside on the inner and outer conductors 21' and 22'. A high dielectric strength between the conductors 21' and 22', up to several kV, is thereby achieved by the layer 21 on the inner conductor 21' given a comparatively small spacing between the conductors 21' and 22'. The layer 31 of the inner conductor 21' also can be applied on the inside of the outer conductor 22' with the same function, allowing the inner conductor 21' can be advantageously cooled better. The application of the layer 32 on the outer side of the outer conductor 22' protects the conductor arrangement against accidental contact.

Figure 4:
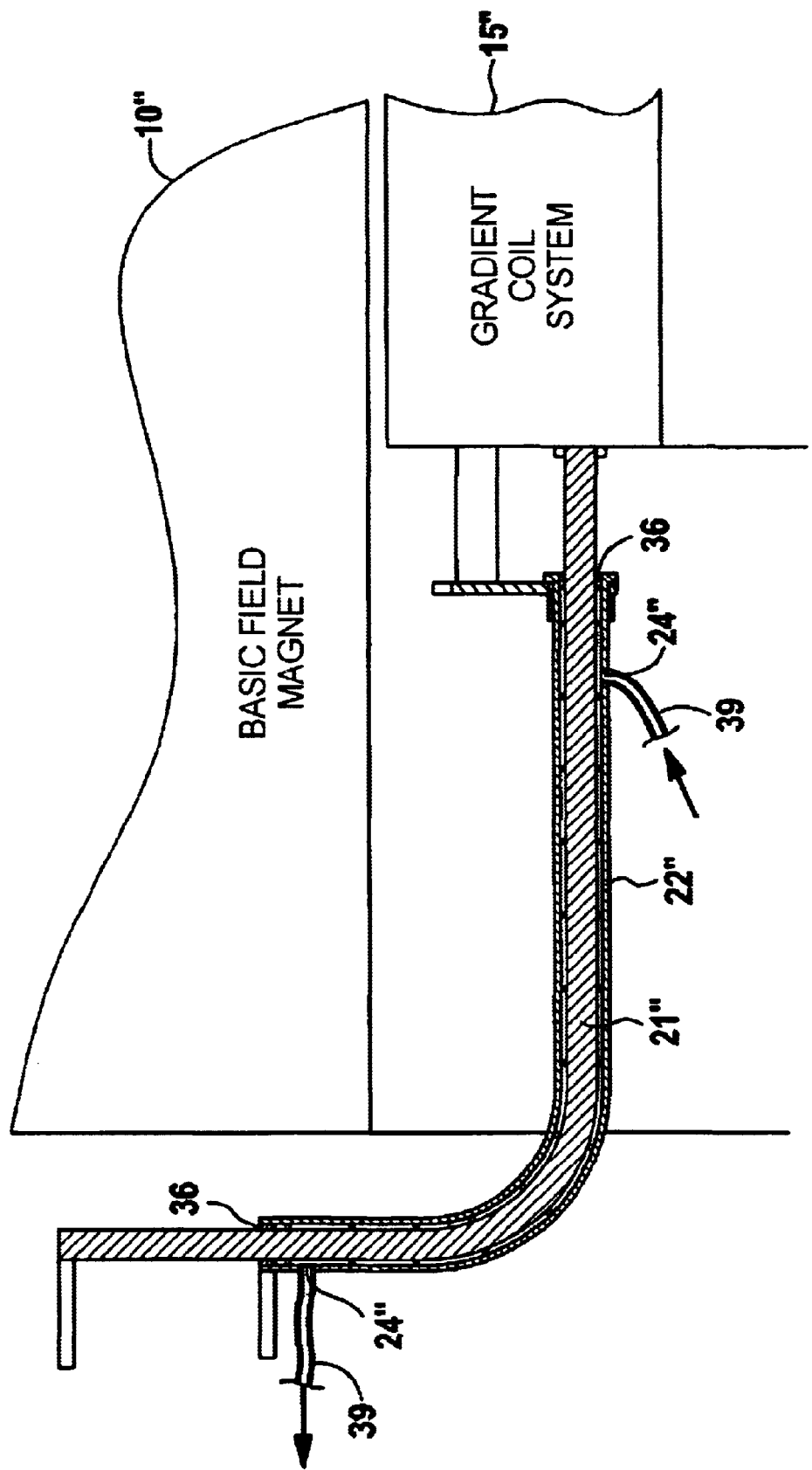
FIG. 4 is a longitudinal section through a portion of a magnetic resonance apparatus having a further embodiment of an inventive electrical conductor arrangement for electrical supply to a gradient coil system.

As a further exemplary embodiment of the invention, FIG. 4 shows portions of a longitudinal section through a portion of a magnetic resonance apparatus having a further electrical conductor arrangement with an inner conductor 21" and an outer conductor 22". Differing from FIG. 1, the conductor arrangement of FIG. 4 has electrically insulating seal elements 36 for a tight closure of the annular gap between the inner and outer conductor 21" and 22", at the end of the outer conductor 22" at the gradient coil system 15' as well as at the end at the end face of the basic field magnet 10". The outer conductor 22' also has at least one bore 24" at each end, so that a liquid coolant, for example an insulating oil or water, can be conducted between the inner and the outer conductor 21" and 22" via the conduit 39. A gaseous coolant also can be employed. For a simple connection of the conduit 39, the openings of the bore 24" can be lengthened as nozzles toward the outside. Otherwise, the description as to FIG. 1 applies correspondingly to FIG. 4.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic apparatus comprising:

a magnetic resonance data acquisition system including a gradient coil;

an electrical conductor connected to said gradient coil and being adapted for connection to a power supply for supplying electrical energy to said gradient coil; and said conductor arrangement comprising an inner conductor and an outer conductor coaxially surrounding said inner conductor and forming a cooling channel, adapted for transmission of a coolant, between said inner conductor and said outer conductor.

2. A magnetic resonance apparatus as claimed in claim 1 wherein said conductor arrangement includes at least one centering element disposed between said inner conductor and said outer conductor and maintaining said inner conductor and said outer conductor spaced from each other.

3. A magnetic resonance apparatus as claimed in claim 2 wherein said centering element has at least one recess therein adapted to allow coolant to pass therethrough.

4. A magnetic resonance apparatus as claimed in claim 2 wherein said centering element is comprised of electrically insulating material.

5. A magnetic resonance apparatus as claimed in claim 1 wherein said outer conductor comprises an admission opening for coolant and a discharge opening for coolant.

6. A magnetic resonance apparatus as claimed in claim 5 wherein said conductor arrangement has an axial end, and wherein at least one of said admission opening and said discharge opening is disposed at said axial end.

7. A magnetic resonance apparatus as claimed in claim 5 further comprising a coolant conduit connected to at least one of said admission opening and said discharge opening.

8. A magnetic resonance apparatus as claimed in claim 1 wherein said coolant is gaseous at room temperature.

9. A magnetic resonance apparatus as claimed in claim 1 wherein said coolant is liquid at room temperature.

10. A magnetic resonance apparatus as claimed in claim 1 wherein said inner conductor and said outer conductor have identical current-carrying capability.

11. A magnetic resonance apparatus as claimed in claim 1 wherein one of said inner conductor and said outer conductor is a forward conductor, and wherein the other of said inner conductor and said outer conductor is a return conductor.

12. A magnetic resonance apparatus as claimed in claim 1 wherein said inner conductor comprises a single wire.

13. A magnetic resonance apparatus as claimed in claim 1 wherein said inner conductor comprises multiple wires.

14. A magnetic resonance apparatus as claimed in claim 1 wherein said outer conductor is composed of solid material.

15. A magnetic resonance apparatus as claimed in claim 1 wherein at least one of said inner conductor and said outer conductor is comprised of material selected from the group consisting of copper and aluminum.

16. A magnetic resonance apparatus as claimed in claim 1 wherein said inner conductor has a substantially circular cross-section and wherein said outer conductor has a substantially annular cross-section.

17. A magnetic resonance apparatus as claimed in claim 1 wherein at least one surface of at least one of said inner conductor and outer conductor is covered with an electrically insulating layer.

18. A magnetic resonance apparatus as claimed in claim 1 wherein said conductor arrangement is flexible.

19. A magnetic resonance apparatus as claimed in claim 1 wherein said gradient coil is rigidly mounted in said magnetic resonance data acquisition system.

20. A magnetic resonance apparatus as claimed in claim 1 wherein said magnetic resonance data acquisition system has an examination space and wherein said gradient coil is movable in said examination space.

* * * * *